(12) United States Patent
Finlay et al.

(10) Patent No.: US 10,996,564 B2
(45) Date of Patent: May 4, 2021

(54) UNIFORMITY CONTROL OF METAL-BASED PHOTORESISTS

(71) Applicant: GLOBALFOUNDRIES U.S. INC., Santa Clara, CA (US)

(72) Inventors: Robert Finlay, Ballston Lake, NY (US); Erik Robert Hosler, Cohoes, NY (US); Sheldon Meyers, Halfmoon, NY (US); Scott Kenny, Ballston Lake, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/867,854

(22) Filed: Jan. 11, 2018

(65) Prior Publication Data

US 2019/0212651 A1 Jul. 11, 2019

(51) Int. Cl.
*G03F 7/16* (2006.01)
*B05D 3/00* (2006.01)
(Continued)

(52) U.S. Cl.
CPC .............. *G03F 7/164* (2013.01); *B05B 3/02* (2013.01); *B05D 1/005* (2013.01); *B05D 3/207* (2013.01);
(Continued)

(58) Field of Classification Search
CPC ........ G03F 7/164; G03F 7/162; G03F 7/2004; G03F 7/0047; B05B 3/02; B05D 1/005;
(Continued)

(56) References Cited

U.S. PATENT DOCUMENTS

| 2006/0060134 A1 | 3/2006 | Kang et al. |
| 2007/0054050 A1 | 3/2007 | Lee et al. |

(Continued)

FOREIGN PATENT DOCUMENTS

| DE | 3407253 A1 | 12/1984 | |
| GB | 2141637 A * | 1/1985 | ............ B05D 1/005 |
| JP | 60138734 A | 7/1985 | |
| JP | 2010155216 A | 7/2010 | |
| TW | 200610583 A | 4/2006 | |
| TW | 201236768 A | 9/2012 | |

OTHER PUBLICATIONS

Jiang et al. "Magnetically assembled iron oxide nanoparticle coatings and their integration with pseudo-spin-valve thin films" J. Mater. Chem. C. 2017 5, 252 Jan. 14, 2017. (Year: 2017).*

(Continued)

*Primary Examiner* — Robert S Walters, Jr.
(74) *Attorney, Agent, or Firm* — Francois Pagette; Hoffman Warnick LLC

(57) ABSTRACT

An EUV photoresist composition includes paramagnetic particles that are adapted to block EUV radiation. The magnetic manipulation of the paramagnetic particles within a deposited layer of EUV photoresist can beneficially impact focus control and the achievable line width roughness during subsequent photolithographic processing. A spin-coating apparatus for dispensing the EUV photoresist composition onto a substrate includes a plurality of concentric electromagnets located beneath the substrate that influence the distribution of the paramagnetic particles in the photoresist layer.

8 Claims, 4 Drawing Sheets

(51) Int. Cl.
  *G03F 7/20* (2006.01)
  *B05B 3/02* (2006.01)
  *B05D 1/00* (2006.01)
  *G03F 7/004* (2006.01)
  *H01L 21/67* (2006.01)
  *H01L 21/687* (2006.01)
  *H01L 21/683* (2006.01)

(52) U.S. Cl.
  CPC ............ *G03F 7/0047* (2013.01); *G03F 7/162* (2013.01); *G03F 7/2004* (2013.01); *H01L 21/6715* (2013.01); *H01L 21/6838* (2013.01); *H01L 21/68757* (2013.01)

(58) Field of Classification Search
  CPC ................ B05D 3/207; H01L 21/6715; H01L 21/68757; H01L 21/6838
  See application file for complete search history.

(56) References Cited

U.S. PATENT DOCUMENTS

2008/0127888 A1   6/2008   Kim et al.
2015/0053886 A1*  2/2015   Gray .................... B82Y 25/00
                                                 252/62.54
2016/0011518 A1   1/2016   Xie et al.

OTHER PUBLICATIONS

Aslam et al. "Spin-coating of moderately concentrated superparamagnetic colloids in different magnetic field configurations" Colloids Surf. A 532, 530-534 Sep. 26, 2017. (Year: 2017).*
Courtesy German Search Report dated Sep. 20, 2018 issued in corresponding German Patent Appln. No. 102018206474.1.
TW Office Action and English Translation thereof for Tawianese Patent Application No. 10820538870 dated Jun. 11, 2019, 7 pages.

* cited by examiner

UNIFORMITY CONTROL OF METAL-BASED PHOTORESISTS

BACKGROUND

The present application relates generally microelectronic device manufacture, and more specifically to an apparatus and methods for fabricating microelectronic device structures using extreme ultraviolet (EUV) lithography.

Extreme ultraviolet (EUV) lithography techniques have been implemented in single exposure lithography processes to achieve desired critical dimension (CD) targets in advanced node (e.g., less than 22 nm) microelectronic device manufacture. However, a challenge facing the implementation of EUV materials and methods is the ability to simultaneously achieve a desired line edge roughness and EUV photoresist sensitivity in order to meet industry targets.

SUMMARY

Notwithstanding recent developments, there is a need for EUV photolithography systems and methods that improve line edge roughness, while simultaneously exhibiting the desired exposure sensitivity. Line edge roughness, which may also be referred to as line width roughness (LWR), is a measure of the variation in the width of the shapes and features formed by photolithography. Sensitivity is a measure of the minimum dose of energy required to image the photoresist.

Improvements in EUV photoresist sensitivity have been achieved by incorporating EUV absorbent media into suitable photoresist compositions. According to various embodiments, EUV photoresists include particles of a paramagnetic material dispersed throughout the resist formulation. The paramagnetic material particles are adapted to absorb or block EUV radiation. However, in comparative processes for forming a layer of the EUV photoresist on a substrate, the distribution of the paramagnetic particles throughout the deposited layer is typically non-uniform and thus hampers effective focus control during development of the photoresist, which contributes to poor line edge roughness.

As disclosed herein, a magnetic chuck apparatus is used in conjunction with a paramagnetic particle-containing EUV photoresist to manipulate the distribution of the paramagnetic particles within a layer of the photoresist that is deposited on a substrate. Electromagnets within the chuck apparatus, for example, may be used to modify the distribution of paramagnetic particles prior to exposing the photoresist layer.

According to various embodiments, an example distribution of paramagnetic particles is radially homogeneous and axially non-homogeneous. That is, the concentration of paramagnetic particles within the photoresist layer may be substantially constant over the substrate from center to edge, but may vary throughout the thickness of the photoresist layer such that the concentration is greater proximate to the substrate.

A method of depositing a layer on a substrate includes dispensing a coating liquid that includes paramagnetic particles and a solvent onto a portion of a substrate while rotating the substrate at a first number of revolutions per minute, and rotating the substrate at a second number of revolutions per minute greater than the first number to disperse the coating liquid over the substrate and form a layer comprising the paramagnetic particles. While the substrate is rotating at the second number of revolutions per minute, an attractive magnetic force is applied to the paramagnetic particles from below the substrate to modify a distribution of the particles within the layer.

A spin-coating apparatus for forming such a layer includes a turntable having a chuck adapted to hold and rotate a substrate, and a plurality of concentric electromagnets positioned below the turntable.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
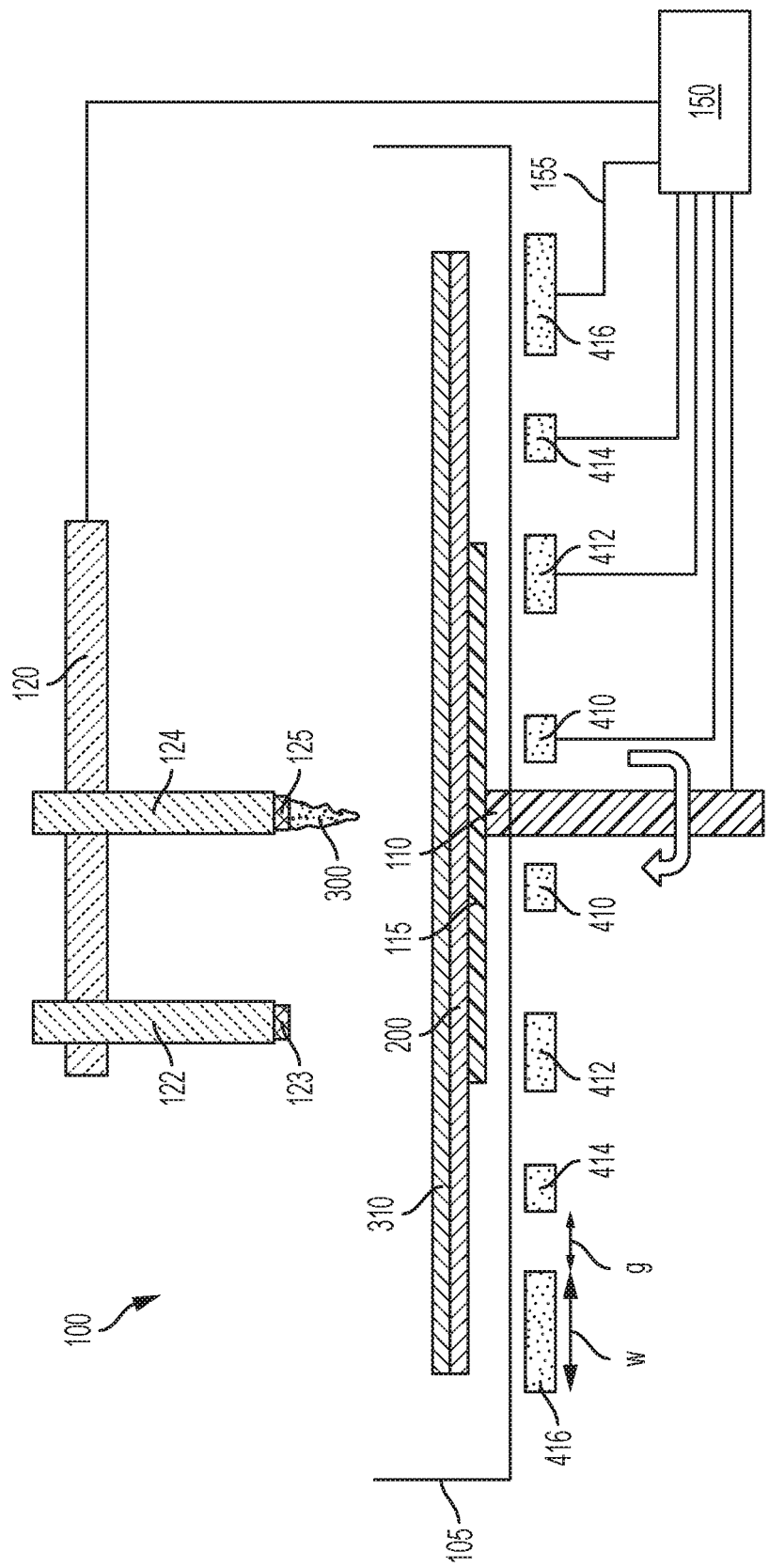
FIG. 1 is a schematic diagram of a coating apparatus according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Extreme ultraviolet (EUV) light refers to electromagnetic radiation having a wavelength of 100 nm or less, e.g., 5 to 50 nm, and includes light at a wavelength of about 13.5 nm. Extreme ultraviolet (EUV) light can be used in lithographic processing to produce fine features on a substrate.

Extreme ultraviolet light lithographic processes typically involve forming a layer of an EUV photoresist composition on the substrate. According to various embodiments, photolithographic methods are implemented in conjunction with a metal-based EUV photoresist that includes paramagnetic particles dispersed throughout the photoresist. The paramagnetic particles, which are incorporated into the photoresist layer formed on the substrate, are adapted to absorb or block EUV radiation, which can enhance development of the photoresist.

As will be appreciated, a wide range of photoresist compositions may be used, including both positive and negative resists. By way of example, suitable photoresist compositions include paramagnetic particles dispersed throughout a mixture of a polymer such as a resin and a solvent. In particular embodiments, the EUV photoresist may be a chemically-amplified resist.

EUV photoresist compositions are solvent-containing, liquid formulations that can be coated onto a substrate to form a metal-containing layer. Example photoresist compositions may include organosilicon polymers, boron carbide polymers, hydrocarbon polymers, and hydrochlorocarbons, which can be used individually or in combination.

In various embodiments, the paramagnetic particles include a metal or a metal derivative selected from metal halides, metal carbides, metal sulfides, metal nitrides, metal oxides, as well as mixtures thereof. Exemplary metals include those selected from the group consisting of cobalt, zirconium, tin, hafnium and lead. As will be appreciated, such metals and metal derivatives may include a paramagnetic phase, and are adapted to absorb or otherwise attenuate energy at EUV wavelengths.

Irrespective of the metal composition, an in accordance with various embodiments, the total metal content in a cured metal-containing EUV photoresist layer may be at least 0.01% by weight, e.g., 0.01, 0.02, 0.05, 0.1, 0.2, 0.5, 1, 2, 5, 10, 20, 50 or 75% by weight, including ranges between any of the foregoing values.

Spin-coating processes may be used to coat the EUV photoresist onto a substrate, such as a semiconductor substrate, glass substrate, or hard disk. The spin-coating processes may be a manual or an automated process. In an example automated process, the substrate is mounted on the turntable of a spinner, and a nozzle for dispensing the EUV photoresist is positioned above the substrate. A desired quantity of the EUV photoresist is dispensed onto a central portion of the substrate and, thereafter, the turntable is rotated at a low spin speed for a time sufficient to disperse the EUV photoresist over the entire surface of the substrate. Subsequently, the turntable spin speed is increased to obtain a layer of the EUV photoresist having a desired thickness on the substrate.

By way of example, a layer of EUV photoresist may be formed by spin-coating at turntable speeds of 200 to 5,000 rpm, e.g., 1,000 to 2,500 rpm, for a time of 20 to 90 sec, e.g., 30 to 60 sec.

The photoresist layer is then typically cured at a temperature of 90 to 150° C., for time periods of 30 to 120 seconds. The thickness of the EUV photoresist layer after curing may be 40 to 160 nm, for example, although lesser and greater thicknesses may be achieved.

The EUV photoresist layer may be patterned by exposure to EUV radiation at a dose of at least 1 $mJ/cm^2$, e.g., 1, 2, 5, 10, 20, 50 or 100 $mJ/cm^2$, including ranges between any of the foregoing values, followed by development of the exposed photoresist. In various embodiments, the EUV photoresist layer is exposed using a mask positioned above the surface of the photoresist layer.

Referring to FIG. 1, shown is a schematic drawing of an example spin-coating apparatus 100. Coating apparatus 100 includes a bowl 105 and a rotatable chuck 110 positioned within the bowl 105. Chuck 110 is configured to support and retain a substrate 200 and, for example, may be a vacuum chuck or an electrostatic chuck. The chuck 110 forms part of a turntable 115. In example embodiments, the chuck 110 and the turntable 115 may be formed from a thermoplastic polymer such as polyether ether ketone (PEEK) or polycarbonate (PC).

Chuck 110 is controlled by controller 150. The controller 150 can control the force used to secure the substrate 200 on the chuck 110. The controller 150 can also control the rotation duty cycle of the turntable 115, including the spin speed and spin duration.

The coating apparatus 100 also includes a movable arm 120, and one or more dispense nozzles attached to the movable arm 120. In the illustrated embodiment, a first dispense nozzle 122 is configured to dispense a casting solvent onto substrate 200, and a second dispense nozzle 124 is configured to dispense a paramagnetic particle-containing EUV photoresist onto the substrate. The output of casting solvent or photoresist from nozzles 122, 124 may be controlled by controller 150.

The first dispense nozzle 122 includes an outlet 123 through which casting solvent is dispensed. In various methods, the casting solvent is dispensed to condition the surface of the substrate 200. The conditioning may improve the kinetics associated with the formation of a layer of photoresist on the substrate 200, and may enhance uniformity of the resulting layer of photoresist and beneficially impact consumption of the photoresist material, i.e., decrease the amount of photoresist dispensed to form a desired layer. Example casting solvents include diglyme, methyl isobutylketone, ethyl cellosolve acetate, and the like, as well as mixtures thereof, although other coating solvent compositions may be used.

The second dispense nozzle 124 includes an outlet 125 through which a EUV photoresist composition 300 is dispensed. According to various embodiments, the photoresist is dispensed over the casting solvent. The centrifugal force created by rotation of the substrate 200 causes the photoresist composition 300 to disperse over the top surface of the substrate 200.

In an example process, while the substrate 200 is rotating at a first spin speed, the casting solvent and photoresist compositions are successively dispensed onto the substrate 200. After dispensing the photoresist composition, the spin speed of the substrate may be increased to a second spin speed, which affects dispersion of the photoresist composition 300, evaporation of solvent from the photoresist composition, and the attendant formation of a layer of photoresist 310.

Figure 3:
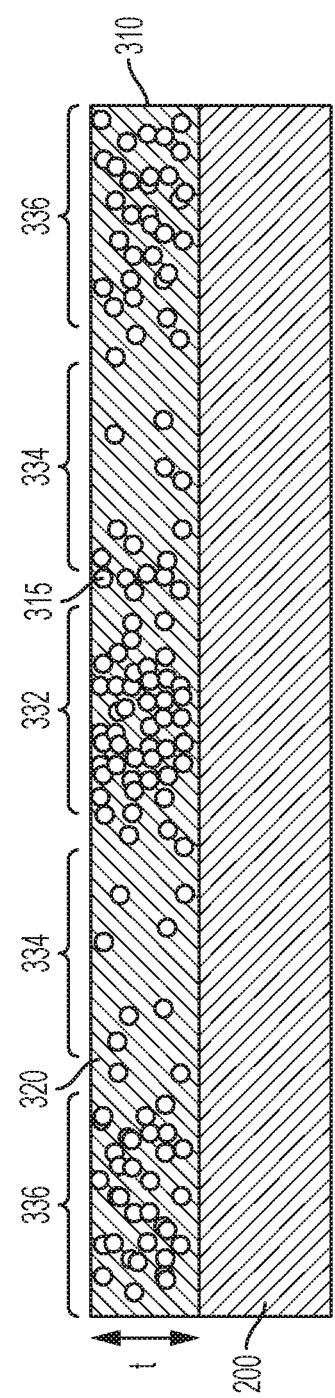
FIG. 3 is a top down view of a portion of a coating apparatus showing an array of electromagnets arranged proximate to a substrate according to various embodiments.

Referring to FIG. 3, shown a comparative photoresist layer 310, which includes paramagnetic particles 315 dispersed throughout a resinous body 320. With respect to the underlying substrate 200, the comparative photoresist layer 310 includes a central zone 332, as well as annular intermediate and peripheral zones 334, 336, respectively. Each zone corresponds to one-third of the radius of a circular substrate. Without wishing to be bound by theory, the centrifugal force that causes dispersion of the photoresist composition 300 may cause a non-uniform radial profile of paramagnetic particles within the layer 310. In particular, although the paramagnetic particles may be homogeneously distributed throughout the layer thickness (t), the concentration of particles 315 within the central and peripheral zones 332, 336 may be greater than the concentration of particles 315 within the intermediate zone 334. Thus, the comparative profile of FIG. 3 may be achieved without magnetic manipulation of the paramagnetic particles 315.

In accordance with various embodiments, Applicant has determined that improvements in both line width roughness and sensitivity can be achieved by manipulating the distribution of paramagnetic particles within the layer 310. In certain embodiments, a layer of EUV photoresist 310 is formed where paramagnetic particles 315 are non-homogeneously distributed throughout the layer thickness (t), yet have a uniform radial profile within the layer 310.

Referring again to FIG. 1, the coating apparatus 100 also includes a plurality of annular, concentric electromagnets 410, 412, 414, 416 positioned below the substrate 200, i.e., below chuck 110. In the illustrated embodiment, the electromagnets are located outside of the bowl 105, which decreases the risk of contamination during spin-coating operations. The electromagnets, which may extend radially beyond an outer diameter of the turntable 115, are each adapted to exert an attractive force on paramagnetic particles 315 during formation of photoresist layer 310. In certain embodiments, each electromagnet may include a planar top surface. In certain embodiments, respective top surfaces of the plurality of electromagnets may be co-planar.

Figure 2:
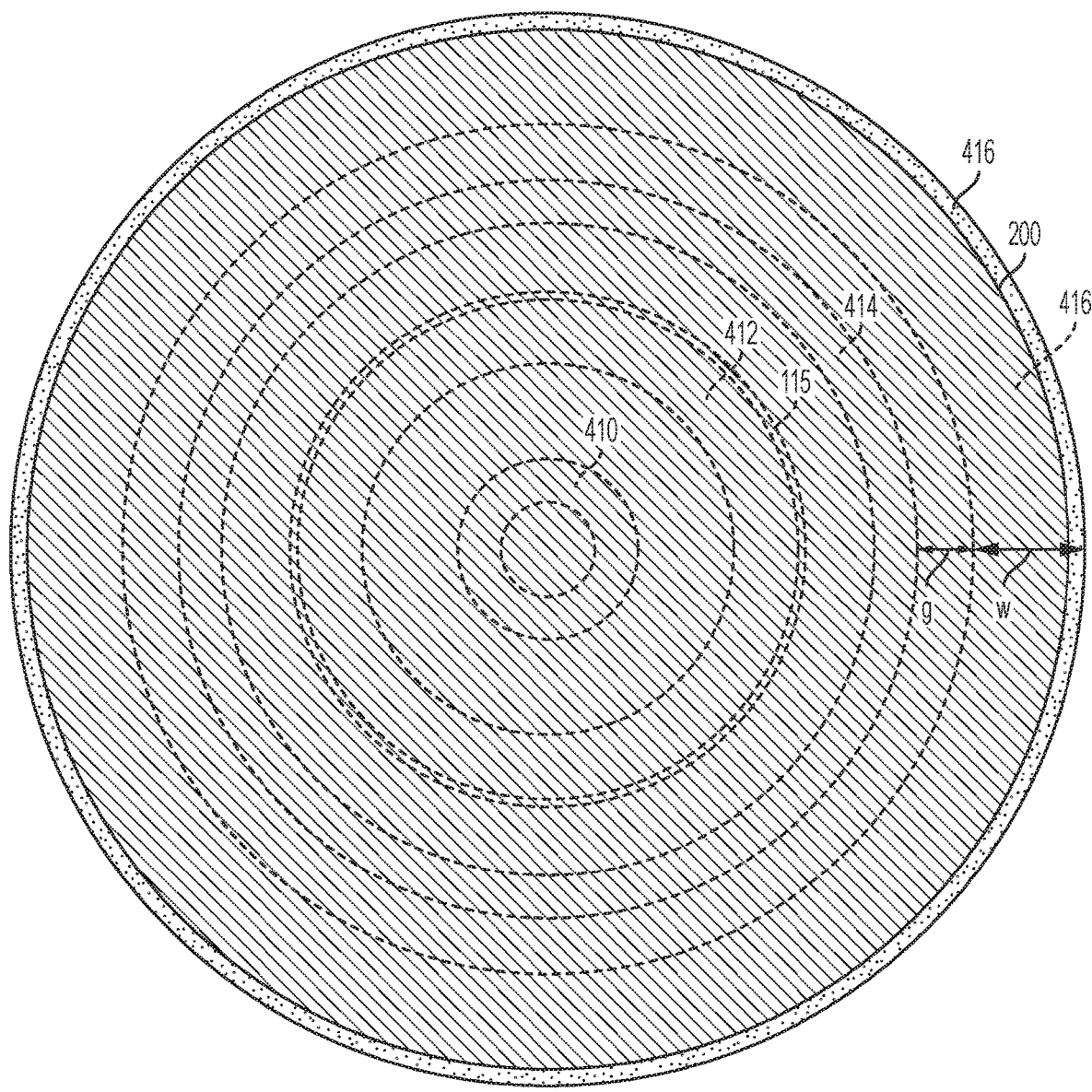
FIG. 2 is a cross-sectional view of substrate coated with a layer of EUV photoresist using a comparative process.

Referring to FIG. 2, a top-down view of a portion of the spin-coating apparatus 100 depicts the arrangement of turntable 115, substrate 200 and electromagnets 410, 412, 414, 416. As will be appreciated, a radial width (w) of each electromagnet and a radial gap (g) between adjacent electromagnets can be independently selected to provide the desired electromagnetic interaction between the electromagnets and the paramagnetic particles 315 dispersed through the layer of photoresist 310. For instance, each electromagnet may have a radial width of 0.5 to 5 cm, e.g., 0.5, 1, 2, 4, or 5 cm, including ranges between any of the foregoing values. In certain embodiments, the radial gap between adjacent electromagnets may range from 0.1 to 5 cm, e.g., 0.1, 0.2, 0.5, 1, 2, 4 or 5 cm, including ranges between any of the foregoing values.

Furthermore, although a coating apparatus 100 with four electromagnets is shown, fewer or greater electromagnets may be used. The spin-coating apparatus may include 2, 3, 4, 5, 6, 7 or 8 electromagnets, for example, including ranges between any of the foregoing values. The electromagnets may be ring magnets, for example, each connected to a power supply and controller 150 via control circuitry 155.

In certain embodiments, each electromagnet 410, 412, 414, 416 can be independently controlled, e.g., during casting of the photoresist layer, to provide a desired magnitude and duration of attractive magnetic force. For instance, one or more of the electromagnets can be turned on after formation of the photoresist layer 310, but prior to evaporation of the solvent therefrom. With such an approach, the paramagnetic particles 315 within the resin 320 are sufficiently mobile to be attracted and repositioned by the electromagnet(s).

Figure 4:
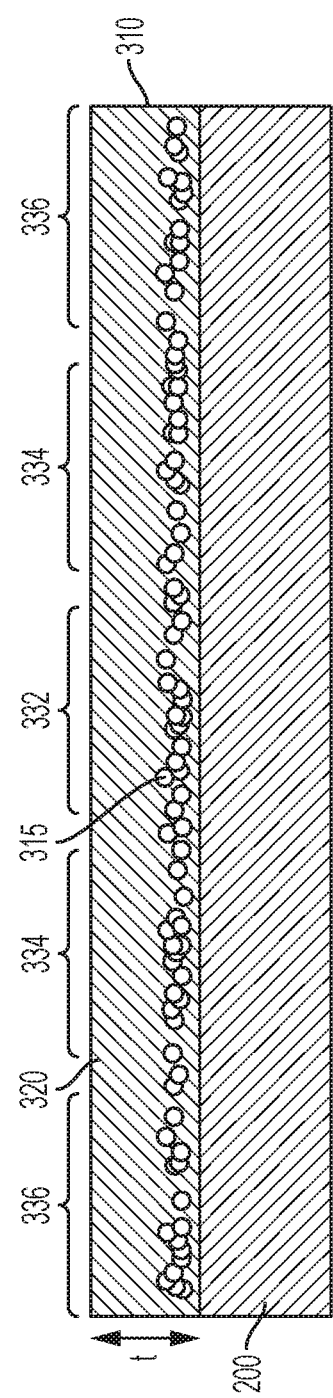
FIG. 4 is a cross-sectional view of substrate coated with a layer of EUV photoresist according to certain embodiments.

Referring to FIG. 4, a magnetically-manipulated photoresist layer 310 including paramagnetic particles 315 dispersed throughout resin 320 is disposed over substrate 200. As shown schematically, the particles 315 are distributed homogeneously along a radial dimension, but are localized within a lower region of the photoresist layer 310 proximate to substrate 200. That is, the concentration of particles 315 may be substantially constant across the central, intermediate and peripheral zones. As used herein, "substantially constant" concentrations vary by less than 10%, e.g., less than 5, 2 or 1%. As will be appreciated, the profile of FIG. 4 results from applying a magnetic force to the EUV photoresist layer before or during the casting step.

By engaging the paramagnetic particle-laden photoresist with the electromagnets during formation of the photoresist layer, it is possible to achieve radial and axial control over the distribution of the paramagnetic particles within the layer. Moreover, the attractive force of the electromagnets can be used to concentrate the paramagnetic particles proximate to a top surface of the substrate. In certain embodiments, the paramagnetic particles 315 may be localized within a lower 50%, e.g., lower 25% or lower 10% of the photoresist layer 310. As used herein, a "localized" distribution of particles means that the distribution is not homogeneous, and that a majority, e.g., greater than 50, 60, 70, 80, 90 or 95%, of the particles are located within a given region of a photoresist layer 310.

Applicant has shown that magnetic manipulation of paramagnetic particles within a deposited layer of EUV photoresist can beneficially impact focus control and the achievable line width roughness in a later-patterned layer. In specific embodiments, a plurality of concentric electromagnets located beneath a substrate during a spin-on process are used to influence the distribution of the paramagnetic particles in the photoresist layer formed on the substrate. In particular, the electromagnets can be used to offset the tendency of the paramagnetic particles to accumulate at the center and periphery of the substrate, as well as throughout the thickness of the deposited photoresist.

As used herein, the singular forms "a," "an" and "the" include plural referents unless the context clearly dictates otherwise. Thus, for example, reference to an "electromagnet" includes examples having two or more such "electromagnets" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a ferroelectric layer that comprises lead zirconate titanate include embodiments where a ferroelectric layer consists essentially of lead zirconate titanate and embodiments where a ferroelectric layer consists of lead zirconate titanate.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of depositing a layer on a substrate, comprising:

dispensing a photoresist material comprising a resin, paramagnetic particles, and a solvent onto a portion of a substrate while rotating the substrate at a first number of revolutions per minute for a first time period;

rotating the substrate for a second time period different from the first time period, and at a second number of revolutions per minute greater than the first number to disperse the photoresist material over the substrate to form a photoresist layer; and applying an attractive magnetic force to the paramagnetic particles from below the substrate, while rotating the substrate at the second number of revolutions per minute, to yield a greater paramagnetic particle distribution within a lower half of the photoresist layer thickness than within an upper half of the photoresist layer thickness, a radially uniform distribution of the paramagnetic particles throughout the photoresist layer, and an increased EUV sensitivity within the photoresist layer;

wherein applying the attractive magnetic force comprises applying power to a plurality of concentric electromagnets disposed beneath the substrate, the plurality of concentric electromagnets including a first electromagnet and a second electromagnet separated by a first radial gap, and a third electromagnet separated from the second electromagnet by a second radial gap, wherein a size of the first radial gap is different from a size of the second radial gap.

2. The method of claim 1, wherein the attractive magnetic force is applied after dispersing the photoresist material over the substrate.

3. The method of claim 1, wherein the attractive magnetic force is applied prior to evaporation of the solvent from the photoresist material.

4. The method of claim 1, wherein after applying the attractive magnetic force the paramagnetic particle distribution within the photoresist layer is radially homogeneous.

5. The method of claim 1, wherein the attractive magnetic force modifies a line width roughness of the photoresist material.

6. The method of claim 1, further comprising arranging the plurality of concentric electromagnets such that the first radial gap and the second radial gap are each between approximately 0.1 centimeters (cm) and approximately 5.0 cm.

7. The method of claim 1, further comprising providing the plurality of concentric electromagnets such that each of the plurality of electromagnets has a radial width between approximately 0.5 centimeters (cm) and approximately 5.0 cm.

8. The method of claim 1, further comprising independently controlling each concentric electromagnet of the plurality of concentric electromagnets to provide a specified magnitude and duration of attractive magnetic force.

* * * * *